United States Patent [19]

Kameya

[11] Patent Number: 4,821,003

[45] Date of Patent: Apr. 11, 1989

[54] ELECTROMAGNETIC VARIABLE DELAY LINE WITH LINEAR COMPENSATION

[75] Inventor: Kazuo Kameya, Tsurugashima, Japan

[73] Assignee: Elmec Corporation, Tsurugashima, Japan

[21] Appl. No.: 139,807

[22] Filed: Dec. 30, 1987

[30] Foreign Application Priority Data

Jan. 19, 1987 [JP] Japan ................................. 62-10229
Feb. 20, 1987 [JP] Japan ............................ 62-24675[U]

[51] Int. Cl.$^4$ ..................... H03H 7/20; H03H 11/26
[52] U.S. Cl. .................................. 333/139; 328/56; 333/23; 333/138
[58] Field of Search ............. 333/28 R, 167, 174, 333/139, 156, 161, 138, 140, 164, 23, 17 R, 17 L, 18; 307/320; 328/56

[56] References Cited

U.S. PATENT DOCUMENTS 3,117,293  1/1964  Mortley .................... 307/320 X
3,260,968  7/1966  Drapkin .................... 333/139

FOREIGN PATENT DOCUMENTS 1065146  4/1967  United Kingdom ............... 307/320

*Primary Examiner*—Marvin L. Nussbaum
*Attorney, Agent, or Firm*—Wegner & Bretschneider

[57] ABSTRACT

This electromagnetic variable delay line includes: a delay line, which includes an inductance device and at least one variable capacitance diode connected thereto, and possessing a non linear operational property; and a circuit device for supplying an output control signal to the variable capacitance diode in a manner which varies non linearly with an input control signal. The circuit means has a non linear property which is substantially complementary and opposite to the non linear delay property of the delay line. Optionally but desirably, the delay line may include: several delay line elments, connected in series, each of which includes an inductance device and a variable capacitance diode connected to the inductance device, the variable capacitance diodes being connected together; and buffer circuits connecting together each adjacent pair of these delay line elements.

3 Claims, 4 Drawing Sheets

FIG. 1
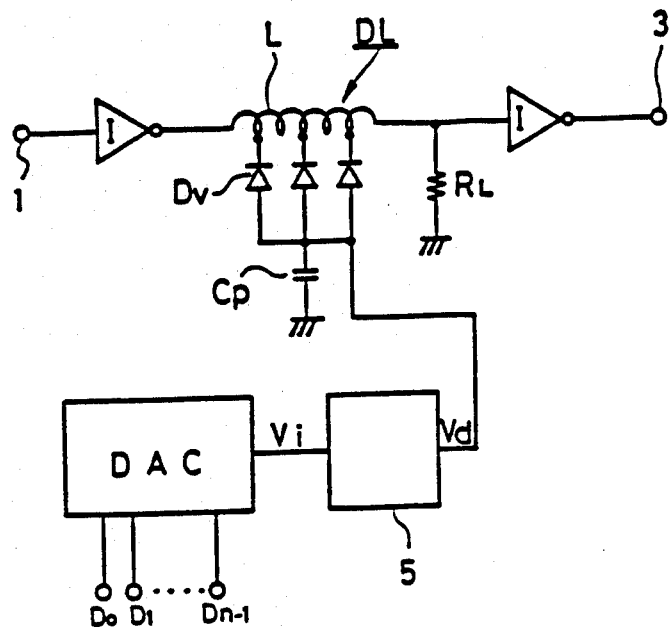
FIG. 2
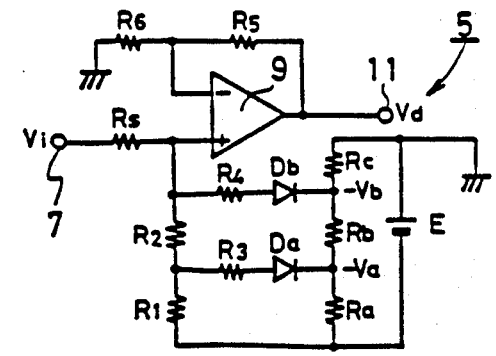
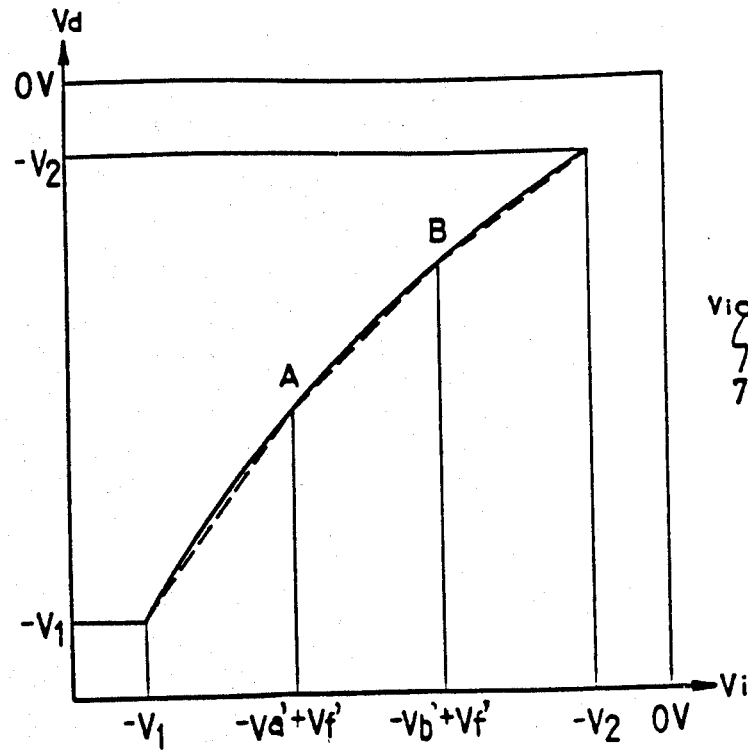
FIG. 3

ELECTROMAGNETIC VARIABLE DELAY LINE WITH LINEAR COMPENSATION

BACKGROUND OF THE INVENTION

The present invention relates to an electromagnetic variable delay line, and particularly to an electromagnetic variable delay line the delay time of which can be variably controlled according to the operation of a control system. Even more particularly, the present invention relates to such an electromagnetic variable delay line, which particularly is suitable for use as a programmable delay line the delay time of which is variably controlled in relatively small steps according to the value of a digital control signal.

In the prior art, there have been proposed various types of electromagnetic variable delay line. Particularly, in FIG. 8 of the appended drawings, which relates to the prior art, there is shown a circuit diagram of an exemplary such conventional type electromagnetic variable delay line. In this prior art delay line, which is denoted as DLa and is of a distributed constant type, there are comprised a ground electrode which is formed around a cylindrical bobbin, a single layer of solenoid wire, and a plurality of taps denoted as T1 through T7; these arrangements are only schematically shown in the figure. Each of this plurality of eight taps T1 through T7 is connected to one of a corresponding plurality of eight input terminals A0 through A7 of a multiplexer MUX, and this multiplexer MUX further has a plurality of select terminals denoted as D0 through D2. Further, there are provided, as shown in the FIG. 8 circuit diagram, a terminal resistor R and an inverter I.

According to the operation of this electromagnetic variable delay line, a digital signal in binary form for controlling the delay time is supplied to the three select terminals D0 through D2 of the multiplexer MUX, and according to the value of said binary digital signal one of the eight input terminals A0 through A7 of said multiplexer MUX is thereby selected, and thereby the input signal supplied to the input terminal 1 of this electromagnetic variable delay line is supplied, via one of the eight taps T1 through T7 and via the corresponding thus selected one of said eight input terminals A0 through A7, to the output terminal 3 of this electromagnetic variable delay line, with a delay time being imparted to said input signal as characteristic of said selected one of the eight taps T1 through T7. Thus, this device is suitable for use as a programmable delay line as it is.

However, this first type of prior art construction for an electromagnetic variable delay line is subject to a number of problems.

First, if it is desired to make the steps of variation of delay time provided more fine, then the number of the taps of the delay line is required to be increased. However, as the number of bits in the binary control signal increases, the number of taps required increases very rapidly, and from a manufacturing view point the provision of such a large number of taps becomes more and more difficult. For example, if the binary control signal is required to be a four bit control signal, sixteen taps are required; and, if said binary control signal is required to be a six bit control signal, then sixty four taps come to be required; and, even worse, if said binary control signal is required to be an eight bit control signal, then a total of 256 taps come to be required. The provision of such a large number of taps is difficult and costly.

Further, even if it were practicable to provide such a large number of taps, the accuracy of delay time variation provided thereby is deteriorated, and in practice it becomes impractical to vary the delay time in this manner. In other words, because the differences in the input capacitances of the input terminals of the multiplexer MUX, the steps of delay time provided between the taps tends to become uneven, and it becomes extremely difficult to achieve an accurate piece wise variation of delay time between the taps. Nowadays, delay lines of the above described type whose provided delay time can be varied in steps of 50 ps are being commercially marketed, but this is nearing the practical limit for such a design, and furthermore the range of delay time available is restricted. In fact, although the demand, potential as well as actual, is extremely strong, it has proved to be extremely difficult to apply this design for an electromagnetic variable delay line to the provision of an 8-bit delay line, such as for example one the delay time provided by which can be varied from zero to 12,750 ps in steps of 50 ps. Further, a demand has evolved for an electromagnetic variable delay line the delay time provided by which can be varied in steps of less than 50 ps, for example in steps of 10 ps, but no such products are currently available due to the above mentioned problems.

FIG. 9 shows an alternate example of conventional electromagnetic variable delay line. In this prior art delay line, which is denoted as DLb and the delay time of which can be varied electronically in a continuous fashion, there are comprised an inductance device comprising a solenoid, and a plurality of taps; again, these arrangements are only schematically shown in the figure. Each of this plurality of taps is connected via a corresponding one of a plurality of variable capacitance diodes which are denoted generically as Dv to one terminal of a bypass capacitor Cp, the other terminal of which is grounded. Further, the junction point of all of the variable capacitance diodes Dv and of said bypass capacitor Cp is provided with a control signal (an inverse voltage) −Vd by way of a variable resistance VR.

According to the operation of this electromagnetic variable delay line, by varying the control voltage −Vd which is applied to the variable capacitance diodes Dv by the adjustment of the variable resistor VR, the capacitance of each of said variable capacitance diodes Dv can be adjusted, and accordingly the delay time provided by the delay line DLb can be continuously varied; in other words, the delay time provided by the delay line DLb can be varied by steps which can be in principle be made arbitrarily short.

However, this second type of prior art construction for an electromagnetic variable delay line is also subject to a number of problems.

Particularly, the relationship between the control voltage −Vd which is applied to the variable capacitance diodes Dv by the adjustment of the variable resistor VR and the resulting delay time provided by the delay line DLb is typically non linear, and may in fact be as shown in the graph of FIG. 10, which also relates to the prior art, and is a graph exemplarily showing said applied control voltage Vd along the horizontal axis and the resulting delay time td provided by delay line DLb along the vertical axis. In other words, even if the control voltage −Vd is increased steadily and continuously, the variation of delay time provided by the delay line DLb is not steady, but rather the rate of change of said provided delay time relative to said control voltage −Vd is greater in the later range of high control voltages than in the initial range of relatively low control voltages. Such non linearity is highly undesirable for practical purposes, because it mean that, in order to provide some particular delay time, it is necessary to prepare in advance a table representing the performance data of the delay line DLb as exemplarily shown in FIG. 10, and to perform table lookup in order to determine the appropriate control voltage (such as exemplarily shown as −Vd1) which should be applied in order to provide any required delay time (such as exemplarily shown as td1). This procedure is highly troublesome, time consuming, and complex, and is impracticable to perform in actual applications. Accordingly, this second type of prior art construction for an electromagnetic variable delay line is in practice only suitable for applications in which the accurate delay time is not required to be known in advance, for instance in an application in which the control voltage −Vd is varied until an agreement in the rising slopes of two signals is obtained in adjusting the timing between two signals. However, this second type of prior art construction for an electromagnetic variable delay line is not suitable for an application in which the accurate value of the actual delay time is required to be known.

SUMMARY OF THE INVENTION

Accordingly, there has become evident a requirement for an improved electromagnetic variable delay line.

Thus, it is the primary object of the present invention to provide an electromagnetic variable delay line, which avoids the various problems detailed above.

It is a further object of the present invention to provide such an electromagnetic variable delay line, the value of delay time provided by which can be controlled substantially linearly with respect to the value of an input control signal.

It is a further object of the present invention to provide such an electromagnetic variable delay line, the delay time provided by which can be controlled relatively finely.

It is a further object of the present invention to provide such an electromagnetic variable delay line which can be readily realized, for example, as a delay line which is controlled by a digital signal.

It is a further object of the present invention to provide such an electromagnetic delay line which can be readily realized, for example, as a delay line which is controlled by an analog signal.

It is further object of the present invention to provide such an electromagnetic variable delay line, the delay time provided by which can be controlled substantially continuously.

It is a further object of the present invention to provide such an electromagnetic variable delay line, the delay time provided by which can be controlled within a relatively wide range.

It is a further object of the present invention to provide such an electromagnetic variable delay line, which does not require any table lookup to be performed in order to determine the appropriate control voltage value which should be applied in order to provide a required delay time value.

It is a further object of the present invention to provide such an electromagnetic variable delay line, which is suitable for an application in which the accurate value of the actual delay time provided thereby is required to be known.

It is a further object of the present invention to provide such an electromagnetic variable delay line, which is suitable for use as a programmable delay line.

It is a further object of the present invention to provide such an electromagnetic variable delay line, which is low in manufacturing cost.

According to the most general aspect of the present invention, these and other objects are attained by an electromagnetic variable delay line, comprising: (a) a delay line, comprising an inductance device and at least one variable capacitance diode connected thereto, and possessing a non linear operational property; and: (b) a circuit means for supplying an output control signal to said variable capacitance diode in a manner which varies non linearly with an input control signal; (c) said circuit means having a non linear property which is substantially complementary and opposite to the non linear delay property of said delay line.

According to such an electromagnetic variable delay line as specified above, since a linear input control signal is converted by the non linear circuit means into a non linear control signal for being supplied to the variable capacitance diode or diodes, and the non linear tendency of this control signal is complementary and opposite to that of the delay characteristics owing to the changes in the capacitances of the variable capacitance diodes, as a result, the delay property of the electromagnetic variable delay line in relation with the value of the input control signal, as a whole, is made to be substantially linear.

And, according to a particular specialization of the concept of the present invention, optionally but desirably, said delay line may comprise: a plurality of delay line elements, connected in series, each of which comprises an inductance device and a variable capacitance diode connected to said inductance device, said variable capacitance diodes being connected together; and buffer circuits connecting together each adjacent pair of said plurality of delay line elements.

BRIEF DESCRIPTION OF THE DRAWINGS

The present invention will now be described with respect to the preferred embodiments thereof, and with reference to the illustrative drawings appended hereto, which however are provided for the purposes of explanation and exemplification only, and are not intended to be limitative of the scope of the present invention in any way, since this scope is to be delimited solely by the accompanying claims. With relation to the figures, like reference symbols, unless otherwise so specified, denote the same parts and so on in the various figures relating to one preferred embodiment, and like parts and so on in figures relating to different preferred embodiments; and:

FIG. 1 is an overall circuit diagram for the first preferred embodiment of the electromagnetic variable delay line of the present invention, and in this figure a non linear circuit incorporated in said first preferred embodiment is shown only as a block;

FIG. 2 is a detailed circuit diagram for one concrete realization of said non linear circuit which was shown by a block in FIG. 1, said particular non linear circuit providing a piece wise functional characteristic;

FIG. 3 is a graph for showing this piece wise performance of said non linear circuit of this first preferred embodiment, showing the supplied input control voltage Vi along the horizontal axis and showing the output control voltage Vd along the vertical axis;

DESCRIPTION OF THE PREFERRED EMBODIMENTS

The present invention will now be described with reference to the preferred embodiments thereof, and with reference to the figures.

The First Preferred Embodiment

FIGS. 1 through 3 show the first preferred embodiment of the electromagnetic variable delay line of the present invention. Referring to FIG. 1, the reference symbols I denote two inverters and the reference symbol DL denotes a delay line which is provided in series between said two inverters I, the input to the first inverter I being provided from an input terminal 1 and the output from the second inverter I being provided to an output terminal 3. And a terminal resistor denoted as RL is connected to the output side of the delay line DL. The delay line DL comprises an inductance device L which comprises a single layer of solenoid wire wound on a rod shaped bobbin, a plurality of intermediate taps from said layer of solenoid wire, and a plurality of variable capacitance diodes Dv the one cathode end of each one of which is connected to a corresponding one of said intermediate taps, so as to form a ladder configuration.

Figure 9:
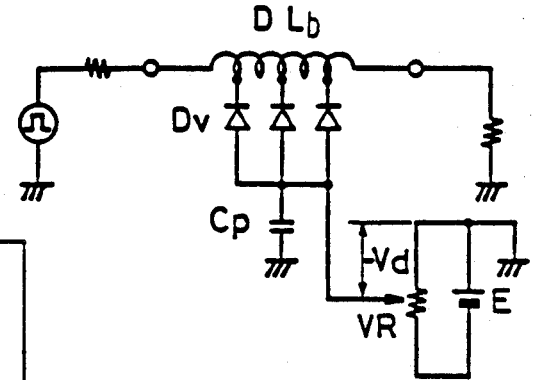
FIG. 9, which also relates to the prior art, is a circuit diagram of an exemplary second conventional type of electromagnetic variable delay line.
Figure 10:
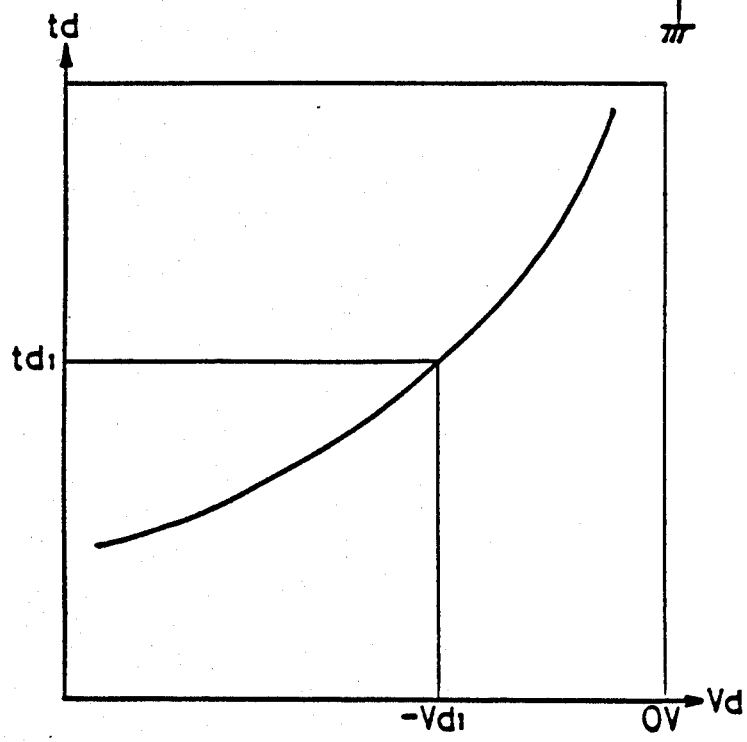
FIG. 10, which likewise relates to the prior art, is an exemplary graph for illustrating the non linear performance of the prior art type electromagnetic variable delay line of FIG. 9, showing the applied control voltage Vd along the horizontal axis and the resulting delay time td provided by said electromagnetic variable delay line along the vertical axis.

The other anode ends of these variable capacitance diodes Dv are connected together and are fed with a signal outputted from a non linear circuit which is denoted as 5 and is only shown in FIG. 1 as a block. This non linear circuit 5 receives a linear input control signal denoted as Vi and converts it into a control voltage (of negative polarity) signal denoted as Vd, said control voltage signal Vd then being supplied to the anodes of the variable capacitance diodes Dv. And the function of this non linear circuit 5 is that it modifies the linear input control signal Vi to produce the non linear control signal Vd with a non linearity property which is opposite and complementary to the non linear property of the delay line DL. In other words, this delay line DL by itself will typically have a non linear property resembling the non linear property shown exemplarily in FIG. 10 of the prior art type delay line described above and whose circuit diagram was shown in FIG. 9; however, the non linear property of the non linear circuit 5 is arranged to be opposite to this non linear property of the delay line DL, so that the two together provide a substantially linear operational property.

In more detail, generally the operational property of a variable capacitance diode Dv is that, for a given change of control voltage, in a region of relatively high control voltage a relatively small change in its capacitance occurs, while on the other hand in a region of relatively low control voltage a relatively large change in its capacitance occurs. Therefore, to complement such an operational property, the non linear circuit 5 is constructed so as to have such a performance characteristic that, for given change of input control voltage Vi, in a region of relatively high such input control voltage Vi (the inverse voltage is low) a relatively small change in the output voltage Vd occurs, while on the other hand in a region of relatively low such input voltage Vi (the inverse voltage is high) a relatively large change in the output voltage Vd occurs.

The Non Linear Circuit 5

In FIG. 2 there is shown a detailed circuit diagram for one concrete realization of the non linear circuit 5 which was shown by a block in FIG. 1. This particular non linear circuit 5 provides a piece wise functional characteristic approximating to the ideal characteristic which is required. Referring to this circuit diagram in detail, an input terminal 7 is connected to the non inverting input of an OP amplifier 9 via a resistor Rs and to the negative side of a voltage source E via resistors R2 and R1. Diodes Da and Db are connected by their one ends to the one end and to the other end of the resistor R2 via resistors R3 and R4 respectively. Resistors Ra, Rb, and Rc are connected in series across the negative power source E, and the other ends of the diodes Da and Db are connected to the junction between the resistors Ra and Rb and to the junction between the resistors Rb and Rc, respectively. Thus, the relative values of the resistors Ra, Rb, and Rc determine the cathode voltages of the diodes Da and Db. The output terminal of the OP amplifier 9 is grounded by way of feedback resistors R5 and R6 which are connected in series, and the junction between said resistors R5 and R6 is connected to the inverting input terminal of said OP amplifier 9.

In the operation of this non linear circuit 5, as illustrated in FIG. 3, when the voltage range of the input voltage Vi is from −V1 to −V2, then so is the voltage range of the output voltage Vd. However, the output voltage Vd changes non linearly with change of the input voltage Vi, as shown by the dashed line in FIG. 3. The solid curved line in FIG. 3 shows the property of such non linear variation which would be ideal, while the dashed line shows the actual property provided.

Thus, as the input voltage Vi rises from the value −V1 and approaches zero, the output voltage Vd approaches zero, but, by adjusting the voltage at the node between the resistors R1 and R2 to be −Va+Vf when the input voltage Vi is −Va'+Vf', the output voltage Vd is made to follow a first slope up to the point denoted in FIG. 3 as "A", i.e. until the input voltage Vi rises to the level of −Va'+Vf'. Here, the symbol Vf denotes the forward voltage drop of the diodes Da and Db.

So long as the input voltage Vi remains lower than −Va'+Vf', since the diodes Da and Db are not brought to be in their conductive states, the input voltage Vi supplied to the non inverting input of the OP amplifier 9 is divided by the resistor Rs and the resistor combination (R1+R2), and the gain is the highest, as shown by the first slope of the dashed line in FIG. 3, up to the point "A" in that figure. This gain may be appropriately determined according to the selection of the values for the feedback resistors R5 and R6.

When the input voltage Vi reaches the value −Va'+Vf', the diode Da transits so as to be in its conductive state. If the value of the resistor R3 is much greater than the value of the resistor Ra, then, since the resistors R1 and R3 are connected in parallel, the voltage applied to the OP amplifier 9 for a given value of the input voltage Vi decreases, and the gain drops somewhat, as shown by the second slope of the dashed line in FIG. 3, from the point "A" to the point "B" in that figure.

By adjusting the voltage at the node between the resistors Rs and R2 to be −Vb+Vf when the input voltage Vi is −Vb'+Vf', then, when the input voltage Vi reaches the value −Vb'+Vf' at the point "B" of the FIG. 3 graph, the diode Db also transits so as to be in its conductive state. If the value of the resistor R4 is much greater than the value of the resistor Rb, then, since the resistor R4 and the combination of the resistors R1 and R3 connected in parallel and the resistor R2 connected in series with said combination are connected in parallel, therefore the voltage applied to the OP amplifier 9 for a given value of the input voltage Vi decreases further, and the gain drops further, as shown by the third slope of the dashed line in FIG. 3, from the point "B" in that figure.

Thereby, this non linear circuit 5 functions as a piece wise linear approximation correction circuit for the diodes Dv shown in the FIG. 1 circuit for this first preferred embodiment of the electromagnetic variable delay line of the present invention. The actual characteristic curve of this non linear circuit 5 as shown by the dashed line in FIG. 3 does not exactly agree with the ideal characteristic curve that would be theoretically desirable as shown by the solid line in said figure, but is close enough for most practical purposes. If further accuracy should be required, then by various modifications of the circuit as shown in FIG. 2 for the non linear circuit 5 the number of linear segments in the FIG. 3 performance characteristic may be increased. Various possible implementations of such modifications will be clear to one of ordinary skill in the relevant art without undue explanation, based upon the disclosures in this specification.

Effects

In the operation of the above described first preferred embodiment of the electromagnetic variable delay line of the present invention, when the control output voltage Vd of the non linear circuit 5 is low (i.e., the inverse voltage is high), then the capacitance change of the variable capacitance diodes Dv is relatively small, while, on the other hand, when said control output voltage Vd of the non linear circuit 5 is high (i.e., the inverse voltage is low), then the capacitance change of the variable capacitance diodes Dv is relatively large. This means that a relatively quickly changing control voltage Vd is supplied to the variable capacitance diodes Dv when the input voltage Vi to the non linear circuit 5 is low, while on the other hand a relatively slowly changing control voltage Vd is supplied to the variable capacitance diodes Dv when the input voltage Vi to the non linear circuit 5 is high. In summary, therefore, the behavior of the delay time of the delay line DL with respect to the control signal that is supplied from some suitable outside signal source to the non linear circuit 5 is substantially linear.

Accordingly, in application of this first preferred embodiment of the electromagnetic variable delay line of the present invention as schematically suggested in the FIG. 1 circuit diagram, when said delay line is combined with a DA converter denoted as DAC which is provided with input terminals denoted as D0 through D(n−1) for receiving a n-bit control signal, the output signal Vi of said DA converter DAC corresponding to the binary value of said n-bit control signal being supplied to the non linear circuit 5 as an input analog voltage signal sorce, a programmable delay line is provided.

In the operation of such a programmable delay line, since the input control voltage Vi from the DA converter DAC has a linear characteristic, the delay time provided by the delay line DL changes in a linear and step wise fashion according to change in the digital input signal.

Furthermore, simply by increasing the number of bits of the digital signal which is supplied to the DA converter DAC, the control signal for the variable capacitance diodes Dv can be varied in small steps, and accordingly the delay time provided by the delay line DL can be varied in small steps. Therefore, in the whole range of variation of the digital control signal, it is possible to arrange that the accuracy of each step can be, for example, 50 ps plus or minus 25 ps when the step size is 50 ps. Further, this result is achieved by using the simple and economical structure detailed above.

Although, in the above described and illustrated first preferred embodiment of the electromagnetic variable delay line of the present invention, the range of the input voltage and the range of the output voltage of the non linear circuit 5 were set to be the same in order to facilitate the convenience of explanation, this should not be taken as being limitative of the present invention, and it is quite possible for the range of the input voltage and the range of the output voltage of the non linear circuit 5 to be different. Further, the basic level of the output voltage may be shifted with respect to the basic level of the input voltage. Yet further, the non linear circuit 5 may invert its output signal with respect to its input signal.

Further, the non linear circuit 5 should not be considered as being limited by the above described type which depends upon piece wise linear approximation. For example, another construction for said non linear circuit 5 might be based upon the exploitation of the non linear property of the relationship between the forward current conducted through a P-N junction semiconductor device and the voltage drop across said semiconductor device. Other possibilities could also be conceived of.

Yet further, the inductance device L is not limited by the above described solenoid type inductance device but may also be other kinds, for example, consisting of electroconductive strips formed on circuit boards in zig-zag, spiral and other shapes. And, when the electromagnetic variable delay line of the present invention is to be applied as a delay line for an analog signal, the inverters I will be omitted.

A Variation

Figure 4:
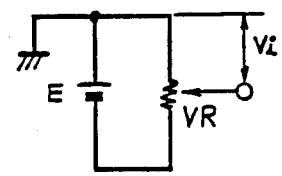
FIG. 4 is a circuit diagram showing an alternative possibility for a control signal source for supplying the input control signal to such a non linear. circuit, said alternative possibility being suitable to be utilized in a variation (not otherwise shown) of the first preferred embodiment of the electromagnetic variable delay line of the present invention.

As suggested in the circuit diagram of FIG. 4, as a variation upon the shown first preferred embodiment of the electromagnetic variable delay line of the present invention, the signal source for supplying the input control signal Vi to the non linear circuit 5 is not to be considered as being restricted to being a DA converter DAC, but alternatively may be a combination of a DC power source with a grounded positive side and a variable resistor VR connected across it for outputting an analog control signal Vi from the movable terminal of said variable resistor VR. Again, other possibilities could also be conceived of.

The Second Preferred Embodiment

Figure 5:
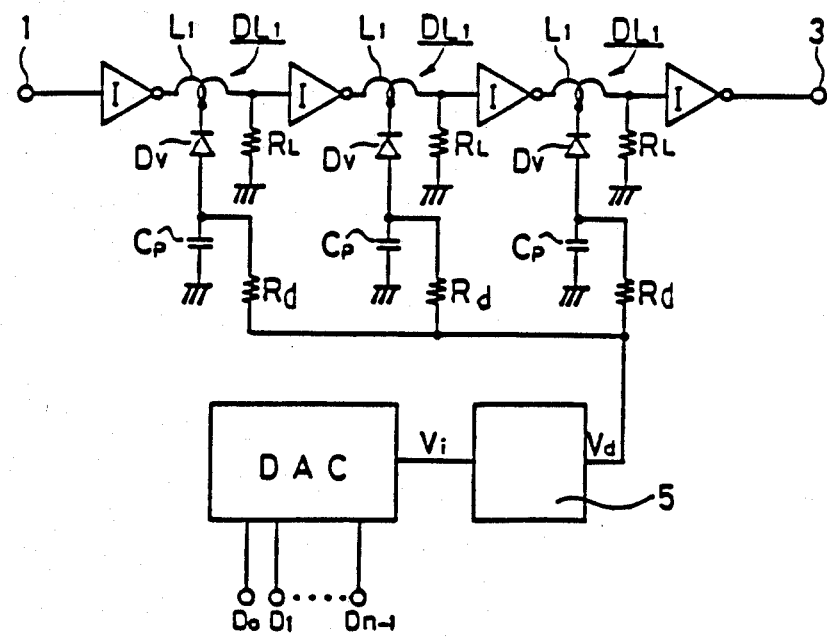
FIG. 5 is similar to FIG. 1 for the first preferred embodiment, being an overall circuit diagram for the second preferred embodiment of the electromagnetic variable delay line of the present invention, and as before in this figure a non linear circuit incorporated in said second preferred embodiment is shown only as a block.
Figure 6:
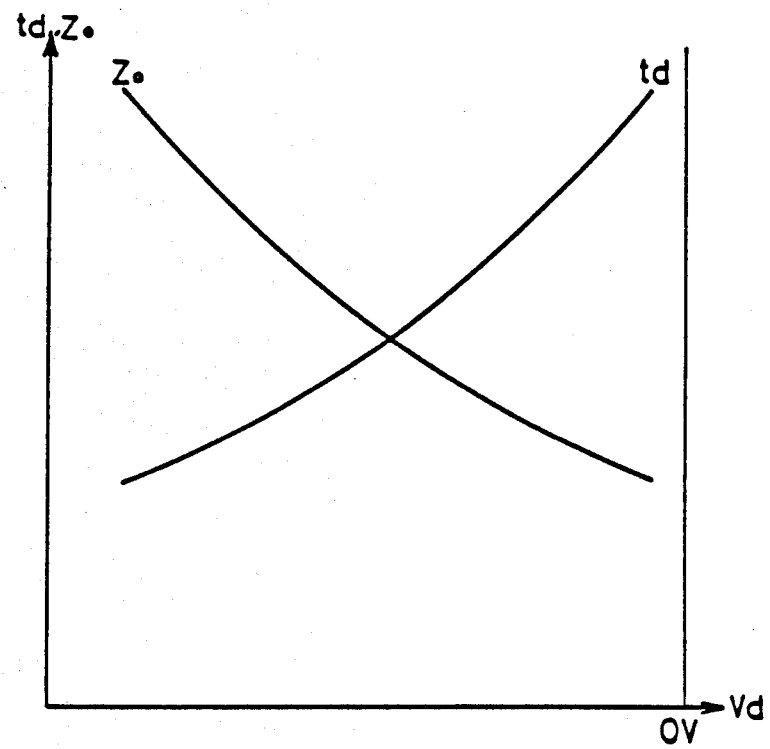
FIG. 6 is a graph for illustrating the relationship between an output control voltage Vd and the characteristic impedance Zo of a delay line DL, in the second preferred embodiment, and shows said output control voltage Vd along the horizontal axis and the delay time and also said characteristic impedance Zo along the vertical axis.
Figure 7:
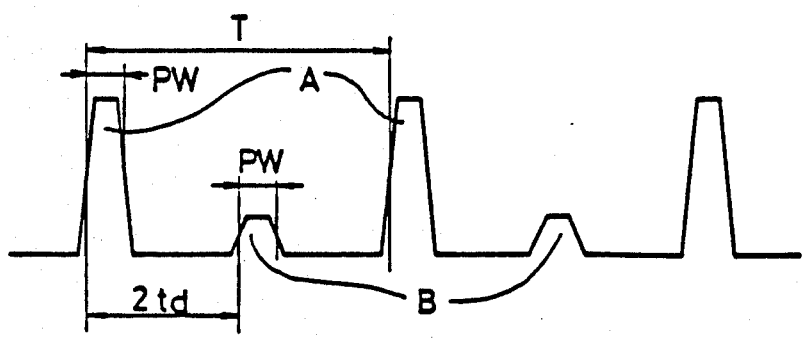
FIG. 7 is a wave form for illustrating poor performance of an electromagnetic variable delay line in the case of mismatching, for demonstration of the advantages of this second preferred embodiment.
Figure 8:
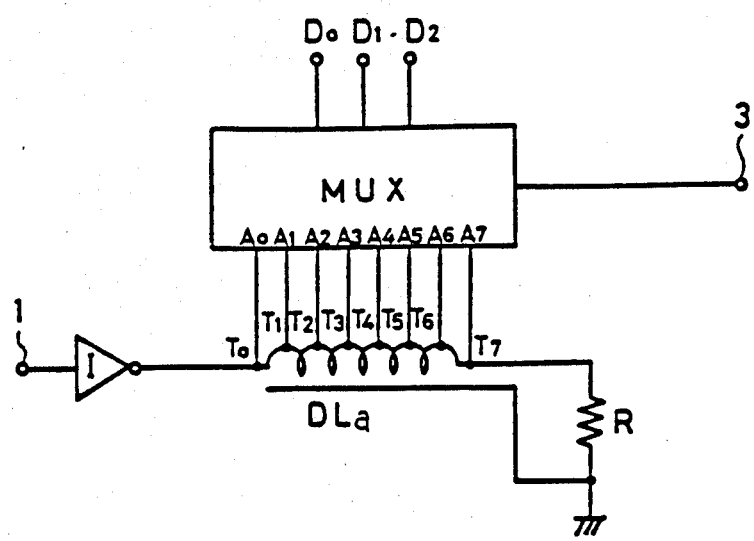
FIG. 8, which relates to the prior art, is a circuit diagram of an exemplary first conventional type of electromagnetic variable delay line.

Next, with regard to FIGS. 5 through 7, the second preferred embodiment of the electromagnetic variable delay line of the present invention will be described. It should be understood that, in FIGS. 5 through 7, like reference symbols to reference symbols in previously discussed figures relating to the first preferred embodiment and to the prior art correspond to like elements. This second preferred embodiment is an improvement over the first preferred embodiment described above. FIG. 5 is an overall circuit diagram for the second preferred embodiment of the electromagnetic variable delay line of the present invention, and, as in the case of FIG. 1 for the first preferred embodiment, in this FIG. 5 a non linear circuit incorporated in said second preferred embodiment is shown only as a block.

In this circuit diagram, four inverters I and three delay line elements DL1 are connected in alternating series between the input terminal 1 and the output terminal 3. Each of these three delay line elements DL1 constitutes a third of the single delay line element DL of the figure, and accounts for one third of the total delay time provided thereby, with said three delay line elements DL1 jointly functioning together as a single delay line; and load resistors denoted as RL are connected to the output ends of each of these three delay line elements DL1. Each of these three delay line elements DL1 comprises an inductance device L1 which comprises a single layer of solenoid wire wound on a rod shaped bobbin, a single intermediate tap from said layer of solenoid wire, a single variable capacitance diode Dv the one cathode end of which is connected to said intermediate tap, and a bypass capacitor Cp which grounds the anode of said variable capacitance diode Dv. The anode ends of the variable capacitance diodes Dv are connected together via individual resistors Rd for restricting the coupling between the delay line elements DL1, and are also connected to the output side of non linear circuit 5, which may be similar to the non linear circuit 5 of the first preferred embodiment described above. If the output impedance of the non linear circuit 5 is sufficiently low, the resistors Rd may be omitted from the construction. In the same way as in the case of the first preferred embodiment, by adding a DA converter DAC to the construction, a programmable delay line may be constituted.

In the operation of this electromagnetic variable delay line, not only does the delay time change substantially linearly with the input control signal as was the case in the operation of the first preferred embodiment described above, but also the accuracy of determination of the delay time is relatively high, and degradation of the output wave form will not be likely to occur, even when an ultra-high speed input signal is supplied.

Since the overall range of variation of this electromagnetic variable delay line is determined as the sum of the contributions of the three delay line elements DL1, the combination functions as a single delay line which has a wide range of variation. By contrast in the case of a variable delay line which has a single delay line DL as its delay element, the relationship between the output control voltage Vd and the characteristic impedance Zo of the delay line DL is non linear in an opposite sense to that of the delay time td, as illustrated in the graph of FIG. 6 in which said output control voltage Vd is shown along the horizontal axis and the delay time td and said characteristic impedance Zo are shown along the vertical axis. Accordingly, mismatching occurs at the terminal end of the delay line DL over most of the range of delay time variation. Accordingly, as illustrated in the wave form of FIG. 7, in such a state of mismatching when the characteristic impedance Zo of the delay line DL is lower than the resistance of the terminal resistor RL, there is a tendency for a positive reflection pulse signal B to be observed, said pulse signal B coming back following a normal pulse signal A after the elapsing of twice the delay time 2td of the delay line DL. If the repetition period T of the normal pulse signal A is close to the value 2td, and the normal pulse signal A and the reflected pulse signal B overlap each other, the rising edge of the normal pulse signal A will become contaminated by the reflected pulse signal B, with the result that the delay time td of the delay line DL apparently shifts from the actual value and the accuracy of the determination of the delay time td is substantially reduced. For this reason, even when the speed and the quality of the ICs and of the delay lines DL which are used are improved, the accuracy may be limited by the reflection time 2td of the reflected pulse signal B. Furthermore, if the pulse width is PW, the period T can not be made less than 2td+PW, within a range where the influence of the reflected pulse signal B is not substantially present. Therefore, the reflection time 2td imposes a limit on the speed of the variable delay line and even when the reflection time 2td is reduced it means a narrower range of delay time variation. On the other hand, according to the second preferred embodiment of the electromagnetic variable delay line of the present invention as shown above, since the delay time of each delay line element DL1 is only one third of the delay time of a single delay line, the reflected pulse signal B involves a reflection time of only ($\frac{2}{3}$)td and the repetition period T is reduced by ($\frac{2}{3}$)td, thereby permitting a wide range of delay time to be provided with good accuracy.

In the second preferred embodiment, the number of delay line elements DL1 can be freely determined according to the particular operational property which is desired. Further, the circuits which connect together the delay line elements DL1 are not to be considered as being limited to being inverters I of FIG. 5, but may be other buffer circuits which further the end of achievement of the goal of the present invention.

It is acceptable, according to the principle of the present invention, if the constructional details of the system are varied, although the shown ones are considered to be preferred. Therefore, although the present invention has been shown and described in terms of the preferred embodiments thereof, and with reference to the appended drawings, it should not be considered as being particularly limited thereby, since the details of any particular embodiment, or of the drawings, could be varied without, in many cases, departing from the ambit of the present invention. Accordingly, the scope of the present invention is to be considered as being delimited, not by any particular perhaps entirely fortuitous details of the disclosed preferred embodiments, or of the drawings, but solely by the scope of the accompanying claims, which follow.

What is claimed is:

1. An electromagnetic variable delay line, comprising:
   (a) a delay line, comprising an inductance device and at least one variable capacitance diode connected to the inductance device, said delay line having an operational property which is non-linear with respect to an output signal supplied to said at least one variable capacitance diode;
   (b) means for sending an input signal;
   (c) circuit means, interposed between said sending means and said at least one variable capacitance diode, for receiving the input signal from the sending means and sending the output signal to said at least one variable capacitance diode, said output signal being linearly related by a constant to said input signal over a plurality of discrete ranges, the constant over each of said ranges being different, so that a property of the output signal is approximately substantially complimentary and opposite to the non-linear operational property of the delay line.

2. An electromagnetic variable delay line, comprising:
   (a) a delay line comprising a plurality of delay line elements connected in series and buffer circuits connecting together adjacent pairs of delay line elements, each of said delay line elements comprising an inductance device and at least one variable capacitance diode connected to the inductance device, said delay line having an operational property which is non-linear with respect to an output signal supplied to said at least one variable capacitance diode;
   (b) means for sending an input signal;
   (c) circuit means, interposed between said sending means and said at least one variable capacitance diode, for receiving the input signal from the sending means and sending the output signal to said at least one variable capacitance diode, said output signal varying non-linearly with respect to the input signal, so that a property of the output signal is approximately substantially complimentary and opposite to the non-linear operational property of the delay line.

3. A delay line as claimed in claim 2, wherein said output signal is linearly related by a constant to said input signal over a plurality of discrete ranges, the constant over each of said ranges being different.

* * * * *